(12) United States Patent
Von Campe et al.

(10) Patent No.: US 8,777,087 B2
(45) Date of Patent: Jul. 15, 2014

(54) METHOD AND APPARATUS FOR APPLYING SOLDER TO A WORK PIECE

(75) Inventors: Hilmar Von Campe, Mainz (DE); Stefan Meyer, Ronneburg (DE); Thai Huynh-Minh, Hanau (DE); Stephan Huber, Rechtmehring (DE); Silvio Reiff, Aschaffenburg (DE)

(73) Assignee: Schott Solar AG, Mainz (DE)

( * ) Notice: Subject to any disclaimer, the term of this patent is extended or adjusted under 35 U.S.C. 154(b) by 0 days.

(21) Appl. No.: 13/032,832

(22) Filed: Feb. 23, 2011

(65) Prior Publication Data

US 2011/0204126 A1    Aug. 25, 2011

(30) Foreign Application Priority Data

Feb. 23, 2010    (DE) .......................... 10 2010 000 520

(51) Int. Cl.
| | |
|---|---|
| *B23K 20/10* | (2006.01) |
| *B23K 1/00* | (2006.01) |
| *H01L 31/05* | (2014.01) |
| *H01L 31/0224* | (2006.01) |
| *B23K 3/06* | (2006.01) |
| *B23K 1/06* | (2006.01) |

(52) U.S. Cl.
CPC ................. *B23K 1/06* (2013.01); *B23K 1/0016* (2013.01); *H01L 31/0504* (2013.01); *H01L 31/022425* (2013.01); *B23K 3/0607* (2013.01); *Y02E 10/50* (2013.01)
USPC ......... 228/110.1; 228/1.1; 228/262; 156/73.1

(58) Field of Classification Search
CPC ................................ B23K 20/10; B29C 65/08
USPC ............. 228/1.1, 110.1, 262; 156/73.1, 580.1
See application file for complete search history.

(56) References Cited

U.S. PATENT DOCUMENTS

| | | | |
|---|---|---|---|
| 3,222,776 A | 12/1965 | Kawecki | |
| 4,778,097 A * | 10/1988 | Hauser | 228/44.7 |
| 5,298,715 A | 3/1994 | Chalco et al. | |
| 6,357,649 B1 * | 3/2002 | Okatsu et al. | 228/179.1 |
| 6,659,329 B1 * | 12/2003 | Hall | 228/111.5 |
| 6,702,175 B1 | 3/2004 | Matsushige et al. | |

(Continued)

FOREIGN PATENT DOCUMENTS

| | | |
|---|---|---|
| CN | 1691492 A | 11/2005 |
| CN | 1773689 A | 5/2006 |

(Continued)

OTHER PUBLICATIONS

European Search Report issued Sep. 28, 2012, corresponding to European Patent Application No. EP 11155362.

(Continued)

*Primary Examiner* — Devang R Patel
(74) *Attorney, Agent, or Firm* — Ladas & Parry LLP

(57) ABSTRACT

The invention concerns a method and an apparatus for the application of solder onto a work piece, wherein the solder is soldered on at a soldering temperature $T_L$ and subject to the influence of ultrasound. In order to be able to solder without difficulties the solder onto work pieces that exhibit sensitivity to breakage it is proposed that the solder is heated, is applied to the work piece that is supported in particular in a spring-mounted manner, and is soldered-on subject to the influence of ultrasound.

18 Claims, 5 Drawing Sheets

(56) References Cited

U.S. PATENT DOCUMENTS

Figure 1:
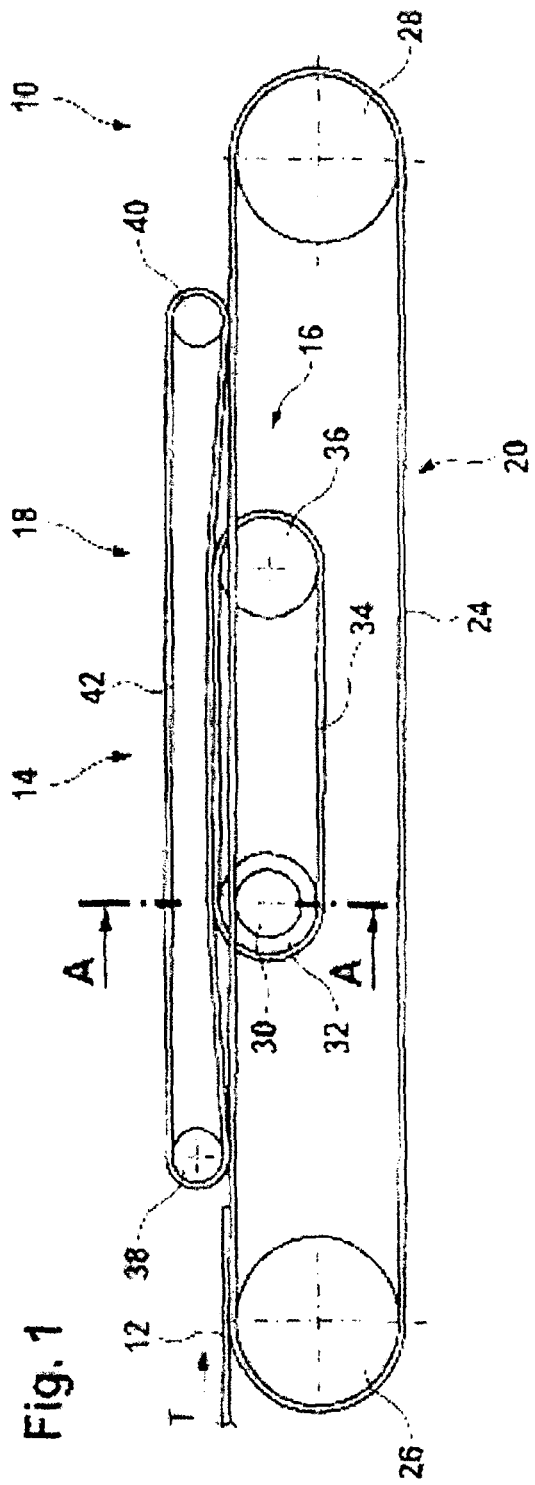

| | | | |
|---|---|---|---|
| 8,143,525 B2 * | 3/2012 | Nishi et al. | 174/126.2 |
| 2005/0205641 A1 | 9/2005 | Takeuchi et al. | |
| 2006/0022018 A1 * | 2/2006 | Yoshimura et al. | 228/54 |
| 2007/0079862 A1 * | 4/2007 | Kawagoe et al. | 136/244 |
| 2009/0155958 A1 * | 6/2009 | Kolodin et al. | 438/120 |

FOREIGN PATENT DOCUMENTS

| | | | |
|---|---|---|---|
| CN | 101072654 A | | 11/2007 |
| DE | 692 22 611 | | 10/1992 |
| DE | 102006035626 A1 | * | 2/2008 |
| EP | 1 699 090 | | 9/2006 |
| JP | 9-295133 | | 11/1997 |
| JP | 09295133 | | 11/1997 |
| JP | 9295133 A | | 11/1997 |
| JP | 09295133 A | * | 11/1997 |
| JP | 2004356280 A | | 12/2004 |
| JP | 2007287934 | | 11/2007 |
| JP | 2007287934 A | | 11/2007 |
| JP | 2008296264 | | 12/2008 |
| JP | 2008296264 A | | 12/2008 |
| JP | 2009176981 | | 8/2009 |
| JP | 2009176981 A | | 8/2009 |
| WO | WO 2008/014900 | | 2/2008 |

OTHER PUBLICATIONS

Bach F-W et al.: "Ultraschallassistiertes Flammloeten Von Aluminiumlegierungen", Schweissen Und Schneiden, DVS VERLAG, Dusseldorf, DE, Bd. 57, Nr. 9, (Jan. 1, 2005), listed as category X in the European Search Report.

Chinese Office Action issued on Nov. 26, 2013, corresponding to Chinese Patent Application No. 201110107846.1.

Japanese Office action mailed Jan. 21, 2014, corresponding to Japanese Application No. 2011037364; with English Translation attached.

* cited by examiner

METHOD AND APPARATUS FOR APPLYING SOLDER TO A WORK PIECE

The invention concerns a method for the application of solder onto a work piece, preferably a semiconductor component such as a solar cell, wherein solder is soldered on at a soldering temperature $T_L$ subject to the influence of ultrasound. Furthermore the invention concerns an apparatus for applying and soldering-on of solder in a soldering zone on a work piece, in particular a semiconductor component such as a solar cell, encompassing a soldering supply device, a heating device for the solder, an ultrasound sonotrode as well as a transport installation for the transport of the work piece relative to the heating device as well as also the ultrasound sonotrode.

From the WO-A-2008/014900 (DE-A-10 2006 035 626) a method for the mounting of a connecting conductor on a solar cell is known where solder is applied by means of ultrasound soldering onto the solar cell. To that effect the solder is soldered on in the form of a soldering wire or of solder form parts by means of an ultrasound sonotrode at soldering temperature.

The soldering on of solder in particular onto solar cell by means of ultrasound exhibits the advantage that a flux means does not have to be utilized, whereby on the other hand the danger of damage to the solar cell increases. By means of the influence of ultrasound oxide layers that are present on the solar cells are broken up in order to assure a mechanically stable and electrically well conducting connection between the solder and the corresponding metal layer of the solar cell. This is in particular then of an advantage if the metal layer is an aluminum layer, such as a backside contact that consists of aluminum.

Corresponding ultrasound soldering methods can be gathered from for example U.S. Pat. No. 6,357,649 or the reference Mardesich et al.: "A Low-Cost Photovoltaic Cell Process Based on Thick Film Techniques; 14th IEEE PV, Sp. Conf. Proc., 1980, pages 943-947.

In the case of the known methods there is the disadvantage that because of the touching down of a soldering apparatus that applies the ultrasound, whereby this can be an ultrasound sonotrode, in the case of work pieces that are sensitive to breakage damage to these ensues. In particular however one observes the disadvantage that in the case when the work piece features an uneven surface the solder connection is not evenly implemented to the required extent. There is also the disadvantage that, because of the melting of the solder due to the thermal energy transmitted by the ultrasound sonotrode, the required heat input cannot be achieved in a reproducible manner to the required extent because of the design of the tip, of the sonotrode, that comes in contact with the solder.

From EP-A-1 699 090 a method and an apparatus are known for the manufacture of solar cell modules. To that effect individual solar cells to be interconnected with one another are guided between conveyor belts, whereby a conveyor belt releases the required thermal energy for connecting sequentially following solar cells with a connector and another belt transmits the pressure required for the connection. Via a third conveyor belt the solar cells are supplied to the first two belts.

From the JP-A-2844330 an ultrasound sonotrode can be deduced via which the solder is applied onto the work piece. The longitudinal axis of the ultrasound sonotrode runs parallel to the normal of the work piece.

In the DE-T-692 22 611 solder materials are described that contain as a component an abrasive.

The present invention has as its object to further improve a method and an apparatus of the kind referred to initially in such a manner that solder can be soldered without difficulties onto work pieces that are sensitive to breakage, in particular onto work pieces of a thickness up to 200 μm and/or with a wavy or slightly curved surface. In this context the possibility of a high throughput while simultaneously assuring reproducible solder joints is to be introduced.

The problem is solved according to the invention by means of a method of the kind referred to initially essentially in such a manner that the work piece is supported during the soldering-on in a spring-mounted manner and/or that the solder, after heating has been implemented, is applied onto the work piece and soldered-on subject to the influence of ultrasound.

The invention distinguishes itself also by the fact that the solder is heated by means of a heating device, is applied to the work piece and is soldered-on subject to the influence of ultrasound and/or that the work piece is supported during the soldering-on in a spring-mounted manner by means of pressing-on the work piece in the direction of the sonotrode by means of a transport installation that is conveying the work piece. Thereby in particular provision is made that the solder, after its heating to a solder temperature $T_L$, is soldered-on by means of the influence of ultrasound. The solder temperature $T_L$ is $\geq T_M$, wherein $T_M$ is the melting point of the solder material. Said melting point is for example in the case of an Sn—Bi-solder material at 140° C. and in the case of an Sn—Pb solder material at 180° C.

According to the invention provision is made in particular that the solder is heated initially to a desired solder temperature in order to then apply the molten solder onto the work piece. Then the desired ultrasound is applied. By these means a reproducible soldering-on or soldering is assured, wherein the heating of the work piece for the positive-adhesive connection with the solder is transferred by the very same directly to the work piece. The heated solder itself carries the heat required for the connection into the work piece material without that a heat transfer has to take place via the ultrasound installation. Hereby a reproducible soldering-on is assured.

In particular the invention provides that the heating of the work piece takes place in such a way that the solder releases its heat to the work piece through the contact with the work piece. In order to assure this, the heating device that is heating up the soldering material can be guided directly above the work piece in the area of the soldering zone, wherein, if applicable, a direct contact between the heating device and the work piece takes place for example by means of runners that originate from the heating device.

The ultrasound installation can be adjusted to the desired soldering temperature as a complementary measure. Furthermore the temperature of the sonotrode should be equal to or slightly higher than the solder temperature $T_L$, as long as no heat is to be removed from the solder.

The temperature of the heating device should preferably be between the solder temperature $T_L$ and 600° C., in particular in the range between 300° C. and 500° C., in particular in the range of at least approximately 100° C. above the solder temperature $T_L$.

In order for the sonotrode not to remove heat from the solder, the temperature of the sonotrode should be between the solder temperature TL and 600° C., preferably in the range between 300° C. and 500° C. Preferably the sonotrode features a temperature that is equal to that of the heating device.

In an in-house inventive implementation that should be emphasized, it is further provided that the work piece is supported in a spring-mounted manner during the soldering. Hereby it is assured that also work pieces whose surfaces vary in their thickness or are uneven can be processed to the required extent and in a reproducible manner. A spring-mounted pressing-on of the work piece against the ultrasound sonotrode takes place, wherein it is assured that the sonotrode head or its tip continuously contacts the molten solder during the input of the ultrasound.

The spring-mounted support of the work piece, due to which the work piece is pressed in the direction of the sonotrode, is made possible via a transport element by means of which the work piece is conveyed underneath and past the sonotrode. The transport element should thereby feature an elastic modulus E in $kN/mm^2$ between $0.01 \ kN/mm^2 \leq E \leq 0.1 \ kN/mm^2$.

By means of these measures highly sensitive work pieces such as silicon-wafers can be processed non-destructively, whereby simultaneously it is assured that no cracks appear due to the temperature adjustment irrespective of the influence of ultrasound.

In particular provision is made that during the soldering process the work piece is transported into the soldering zone and through it via transport installations that are for example implemented as drive belts. The solder, which is in the shape of a wire, can be introduced into the soldering zone via a standard, commercially available wire feeder. To that effect the solder wire can be slid into a heating device in which the solder melts. Subsequently following solder wire pushes the melted material via a discharge opening out in order that the soldering material is applied onto the work piece. Hereby already the molten soldering material can come in contact with the sonotrode that is preferably also heated.

The heating of the sonotrode is in the case of large application areas not stringently necessary. If after the application of the solder onto this a, for example, conduction path is to be soldered-on, as this is the case with connecting conductors with solar cells as work pieces and therefore narrow solder strips are soldered-on, then during the course of the soldering-on of the solder, if a constant temperature were not maintained to a sufficient extent, it would not be assured that the separation forces of the conduction path remain the same over the extent of the conduction path length. This is in particular the case when the conduction path cross section is below 5 $mm^2$.

An even temperature in the soldering zone is achieved when the solder is conveyed through a heating device that radiates heat directly onto the work piece. The solder can be conveyed by means of the metal plate that extents along the work piece. Sufficiently powerful heating elements are likewise required. Heating elements and heat capacity are to be laid out such that the melting heat and crystallization heat can be supplied and removed in a short time. In the context the supply of the melting heat is, as was mentioned, independent of the temperature of the sonotrode that likewise can be heated.

The heat removal should take place primarily within the work piece, such as in a silicon wafer as a work piece that releases the heat to the surrounding air. The transferred heat leads to only a slight heating up of the silicon wafer itself so that directly thereafter further processing can take place.

The teaching according to the invention encompasses however also the possibility that immediately after the effect of ultrasound on the soldered-on solder a conductor such as connecting conductors of a solar cell is soldered on.

Solder and sonotrode should be brought directly into contact at the one and the same location with the metallization of the solar cell as work piece, wherein the spacing a between the sonotrode and the metallization can be: $0 < a \leq 500 \ \mu m$, in particular $50 \ \mu m \leq a \leq 100 \ \mu m$.

According to the invention ultrasound power and -frequency, solder supply and soldering temperature are controlled or adjusted independently of one another so that a soldering-on of the solder onto the work piece that leads to damages such as break- and crack formation can be avoided.

The fact that by means of the ultrasound soldering according to the invention cracks, especially in a semiconductor component such as a solar cell, do not appear is assured by means of the very gentle heat supply. According to the invention the supply of heat takes place via the heated solder itself, even if the semiconductor component can be heated via a additional heater, without this being stringently necessary. Rather it is in particular provided that the necessary process temperature is exclusively provided by the heated solder. The additional heater can be provided if it is desired that the cooling-off of the solder due to heat conduction in the work piece is to be minimized. In the case of solar cells the heat capacity and also the heat conduction are low because of the minor thickness, such as for example up to 200 μm. Since however for the later soldering-on of connecting conductors also only relatively small amounts of solder are applied, an additional heater can, if applicable, find use in order to assure reproducible results.

The invention is however also not left in the case when an additional heating device is utilized that is used, on the one hand, for the pre-heating of the semiconductor component and, on the other, for the melting or heating of the solder material.

For this purpose for example a hot-air nozzle can be utilized that pre-heats the solar cell or melts the soldering material. In this case a sliding-along of the heating device on the semiconductor material is not necessary.

By means of the adjustment of the temperature of the solder and that of the sonotrode and the heating device a temperature gradient forms out of the soldering location that excludes because of the teaching according to the invention a crack formation, By means of the adjustment of the power as well as the frequency of the ultrasound installation it is furthermore assured that the solder becomes part of a connection or an alloy with the work piece material—in the case of the backside of a solar cell with a sintered or a sputtered aluminum layer—to the required extend and that a sufficient adhesive strength is assured with the consequence that the pull-off forces that then act on the conduction paths to be soldered-on do not lead to a release.

It has been determined that in the case when the process heat is supplied by means of the solder, preferably exclusively by means of the solder onto the work piece such as solar cells in danger of breaking, an extraordinarily gentle method is available.

By means of the application of ultrasound it is assured that possibly present oxide layers on the work piece surface onto which the solder is to be soldered-on are broken up so that the desired connection between solder and material or an alloying of the solder with the material is possible to the required extent. A possible explanation is that the introduction of ultrasound oscillations into the solder melt generates cavities that collapse and carry shock waves into the material of the metallization. Through this micro-mechanical stress the material structure that is located below is destroyed and for example an alloy formation with the solder is initiated. Oxide layers that are located on the metal surface are destroyed so that a soldering without flux means is possible, If a sufficiently rigid alloy is to be generated then the soldering temperature is selected to be sufficiently high, wherein the secondary condition is to be considered that the photovoltaic properties of a solar cell are not affected negatively provided a solar cell is utilized as work piece.

If the solder is to be soldered onto an aluminum layer, temperatures up to 500° C. can be required. It is thereby provided that the temperature of the solder material is adjusted to between 180° C. and 500° C., preferably 250° C. and 400° C., in the case of a solder material that consists of tin or contains tin. The properties of the solar cell are hereby not negatively affected.

In the sonotrode standing longitudinal waves are generated that extend in the longitudinal direction of the sonotrode. The sonotrode is thereby designed in such a manner in regard to the wavelength that the antinode is established in the sonotrode head, meaning the tip that comes in contact with the solder. The desired cavities can hereby form. If in particular oxide layers are to be destroyed, then it can be of an advantage if the longitudinal axis of the sonotrode does not coincide with the normal to the surface, which is facing the sonotrode, of the work piece. According to the invention it is therefore provided that the longitudinal axis of the sonotrode is adjusted to the normal at a defined angle. This angle is between 0° and 90°, whereby in the case where the longitudinal axis of the sonotrode and the normal do not coincide, an angle between 20° and 60° should be adjusted, relative to the normal. By these means oxide layers can be broken up to the required extent, as this is the case with ultrasound metal welding.

Independently thereof the ultrasound system can be uninterruptedly active in a further improvement of the teaching according to the invention for the attainment of process stability in order to avoid possibly arising resonance deviations during the activation of the ultrasound systems. An uninterrupted operation of the ultrasound systems also has the advantage that solder-related wetting properties are stabilized.

A further in-house inventive thought provides that in the case of solar cells as semiconductor components instead of busbars that consist for example of silver, soldering strips by themselves connect the fingers that were previously applied on the solar cell.

Since the busbars in the shape of the soldering strips have to connect the fingers in an electrically conducting manner without that a contacting-through to the facing semiconductor substrate of the solar cell may occur, whereby otherwise short circuits would be created, it has to be assured that during the soldering-on by means of ultrasound the outer layer, of the solar cell, that consists in particular of $SiN_x$ and that serves as an antireflection layer, is not destroyed. To that effect the thought is utilized according to the invention that the longitudinal axis of the sonotrode encompasses an angle with the normal to the solar cell surface that is larger than 0°, in particular in the range between 20° and 60°. Contingent on this, transversal oscillation components of the ultrasound oscillations act during the ultrasound soldering so that specifically a soldering to the fingers (soldering strips or bars) can take place without that the front layer, such as the $SiN_x$-layer, is destroyed in such a manner that a contact with the semiconductor layer that is located below takes place. The soldering-on of the soldering-strips takes place preferably at low ultrasound frequencies in the range between 20 to 40 kHz.

In particular it is provided that the ultrasound waves are applied with a longitudinal axis of the sonotrode that is aligned in an inclined manner or, in an extreme case, parallel to the plane spanned by the work piece. An excitation of the sonotrode can also take place with a frequency that deviates from the resonance frequency. This can be accomplished by detuning the sonotrode or through the selection of a length of the sonotrode that deviates from λ/2 or from an integer multiple of λ/2.

According to the invention solder can be applied in the shape of soldering strips that consist in particular of tin and are applied at a velocity between 2 mm/sec and 200 mm/sec, in particular between 22 mm/sec and 80 mm/sec. The possibility exists thereby also to apply soldering strips as busbars on the front side of a solar cell with ultrasound. The soldering strips, meaning preferably tin strips, should feature a width between 1 and 3 mm, preferably approximately 2 mm.

In an improvement of the invention provision is made that the solder contains abrasives in order to in particular break up the surface of the metal layer, onto which the solder is to be soldered-on, or to remove oxide layers.

For example abrasives can be utilized such as can be gathered from the DE-T-692 22 611, to the disclosure of which reference is expressly made.

Additionally or alternatively alloy components can be utilized that are dissolved in the solder and precipitate during the cooling-off of the solder and that form precipitates that are as hard as possible. In this context a solder consisting of tin or containing tin that is for example enriched with a metal element Me can precipitate during a minor cooling-off micrometer-sized solid particles of the element Me or the compound $Sn_xMe_{1-x}$, which for example can reinforce the mechanical abrasion of an oxide layer. Me can thereby be at least one metal out of the group Zn, Ag, Cu, Al, Mg, Ca, Ba, Pb, Sb, Bi, Ni, Ge, Si.

Furthermore the invention provides that prior to the application of the solder an oxide layer that is present on the work piece, such as an aluminum oxide layer, is smoothed by means of for example stroking with a tool. By these means the oxide layer is plastically deformed, whereby due to the existing brittleness destruction ensues.

By means of the application of ultrasound and its alignment with the normal oxide layers that are present, such as aluminum oxide layers, can be destroyed by means of the ultrasound that is coupled in during the soldering-on. Simultaneously the surface layer structure of the work piece is broken up due to the cavities that arise and collapse in the solder because of the coupled-in ultrasound, so that an alloying of the solder in the layer material is made possible. An alloy forms between the solder and the layer material. The extent of this partial reaction is affected via the angle adjustment of the longitudinal axis of the sonotrode to the normal of the work piece surface and is to be optimized corresponding to the metallization layer material onto which the solder is soldered-on.

An additional process parameter to be considered is the spacing between sonotrode head, meaning the tip, to the work piece surface, via which the thickness of the solder layer (height) above the work piece is prescribed. The thickness can be adjusted mechanically by simple means.

This can take place by means of the spacing of the sonotrode, meaning its head or tip, to the work piece surface. In this context it is in particular provided that by means of a micrometer screw the sonotrode is adjusted at a spacing between 0 μm and 500 μm, preferably between 50 μm and 100 μm, to the surface, so that by these means the melt depth is prescribed.

The sonotrode, meaning its tip, should furthermore be disposed between the runners of the heating device that, if applicable, brace themselves on the work piece, and namely in the longitudinal direction of the runners, as viewed in the area of the front ends or in front of them. The runners should therefore exhibit the temperature of the solder heater, meaning the temperature of the solder at the exit from the heating device, so that as a result defined temperature conditions dominate.

The ultrasound installation being utilized and that encompasses a sonotrode or a similarly acting element should be excited at a frequency between 20 kHz and 100 kHz, preferably in the range between 40 kHz and 80 kHz.

In order for the work pieces onto which the solder is soldered-on to be processed without breakage the work pieces are supported semi spring-mounted. To that effect it is for example provided that the work pieces are introduced via drive belts, round section cords or flat belts into the soldering zone in which the heating device with the sonotrode is disposed. Since during the lowering of the ultrasound sonotrode onto the work piece a force is exerted on it via the solder that could lead to a bending, a soft or spring-mounted bracing takes place that takes place, as mentioned, in particular through the bracing on transport belts that compensate for the excursion of the work piece because of the touching down of the ultrasound sonotrode. Consequently a bending of the work piece, which can occur to different degrees from work piece to work piece, will not lead to damages. Furthermore this provides the advantage that a positioning that is exact to the micrometer of the sonotrode to the surface of the work piece is not stringently required since the conveyor bands or belts press the work piece with essentially constant low force in the direction of the sonotrode.

As a result an apparatus of the kind referred to initially distinguishes itself in that the transport installation transports the work piece through the soldering zone in a spring-mounted manner.

It is proposed that the transport installation transports the work piece through the soldering zone in a spring-mounted manner by means of the pressing-on of the same in the direction of the ultrasound sonotrode.

In particular it is provided that the transport installation encompasses first and second transport elements between which the work piece is fixated in a clamped manner, whereby the first transport element is actively driven and the second transport element is driven by means of frictional engagement with the first transport element or the work piece.

In particular the first and the second transport element are endless flat- or round elements such as flat belts or round sections, wherein the first and/or the second transport element features two endless flat- or round elements that are spaced apart facing each other and that are guided respectively by guide rollers that originate from a common axis. The first transport installation should thereby be driven via a third transport installation via which the work piece can be delivered to the first and second transport installation, in the area of which the soldering zone extends.

The heating device and the ultrasound sonotrode should originate from a common retaining means relative to which the heating device and the ultrasound sonotrode can be adjusted as a unit to the transport plane, of the work piece, that is established by the first transport installation. In addition a relative adjustment is possible between ultrasound sonotrode and heating device in order to be able to adjust the thickness (height) of the solder to be applied. The width is additionally dependent on the amount of the solder application.

The heating device features a discharge opening that releases molten solder and is aligned toward the transport plane. Further the sonotrode, with its sonotrode head that contacts the molten solder, can be disposed directly in the area of the discharge opening or be spaced apart from it.

Furthermore it is provided that the apparatus features at least on gas supply channel that is isolated relative to the heating device and via which inert gas can be supplied to the soldering zone. In this context this can be argon, nitrogen or forming gas.

In an improvement of the invention it is provided that a cleaning device is associated with the heating device or ultrasound sonotrode or the common retaining means in order to remove solder-related incrustations on the heating device or the sonotrode. A vacuum device can also be provided in order to remove solder-related contaminations.

Since all essential process-relevant components originate from the common retaining means, simple maintenance can be performed.

Further details, advantages, and characteristics of the invention can be gathered not only from the claims, from which the characteristics can be gathered—as such and/or in combination—but also from the following description of a preferred embodiment example.

Figure 2:
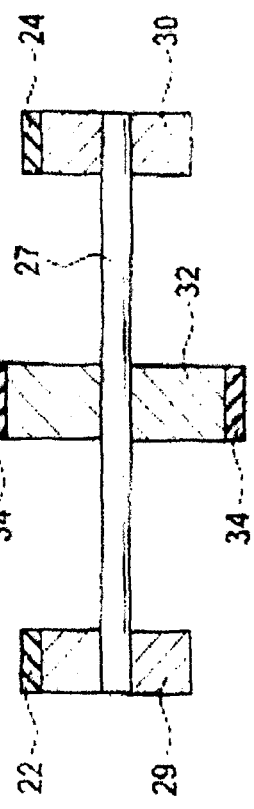

The drawings show:

FIG. 1 a side view of the transport installation,

FIG. 2, a cut along the line A-A of FIG. 1.

Figure 3:
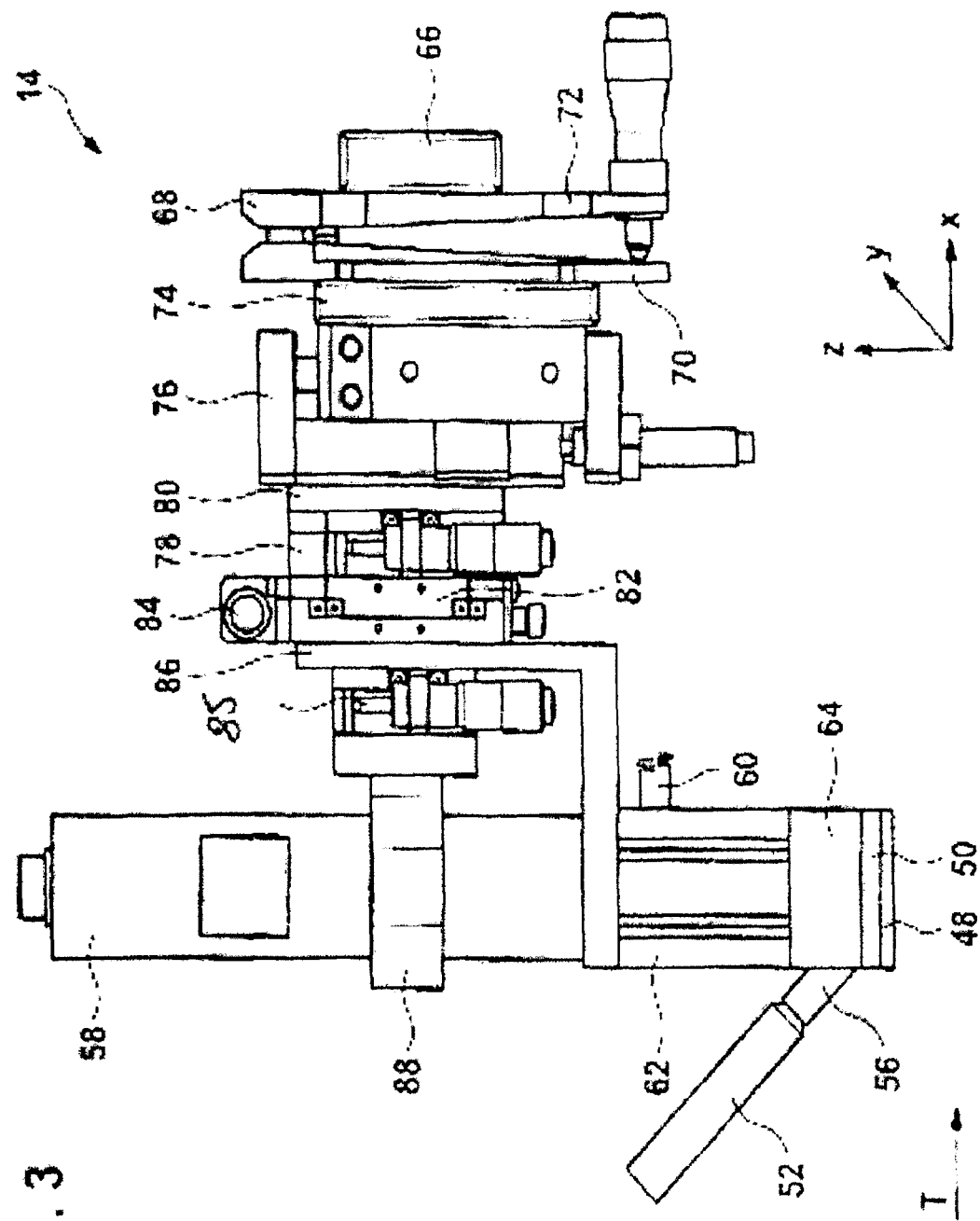
Figure 4:
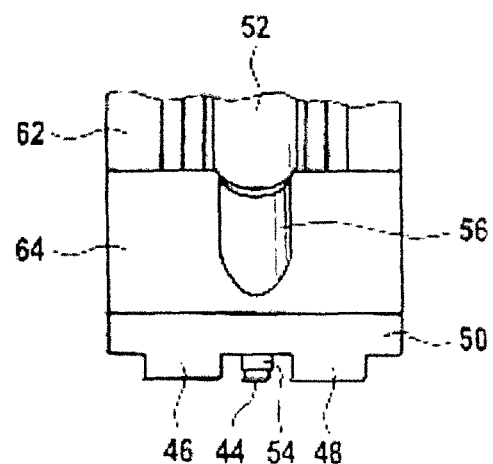
Figure 5:
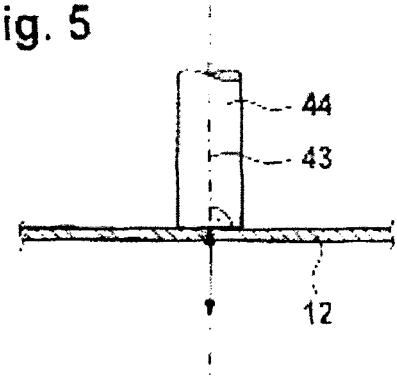
Figure 6:
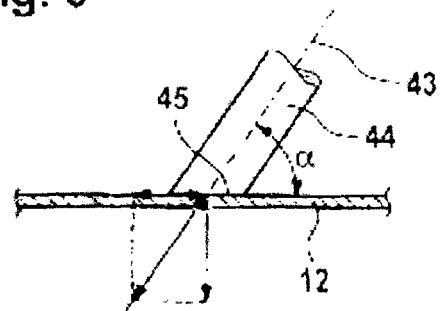
Figure 7:
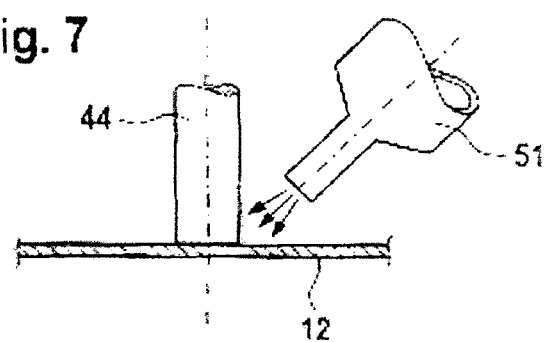
Figure 8:
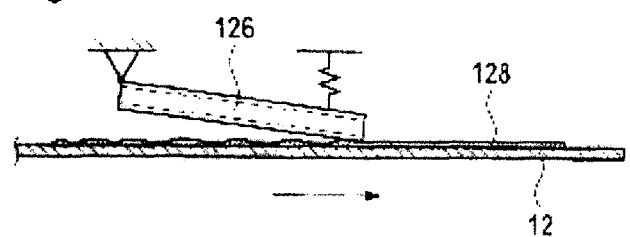
Figure 9:
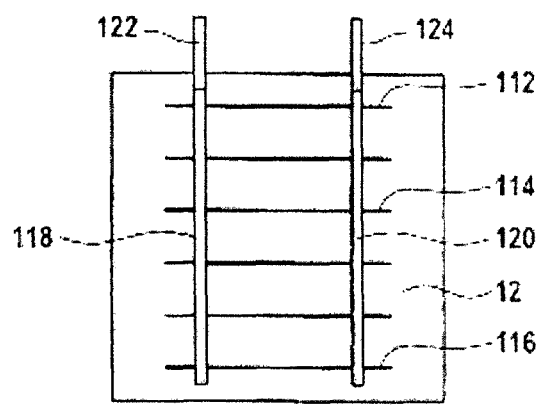

FIG. 3 a schematic diagram of an apparatus for the release of molten solder with ultrasound installation, FIG. 4 a section of arrangement according to FIG. 3, FIG. 5 a positioning of the sonotrode of an ultrasound installation relative to a semiconductor component, FIG. 6 an alternative positioning of the sonotrode relative to the semiconductor component according to FIG. 5, FIG. 7 an arrangement in a cut for the heating of a semiconductor component, FIG. 8 an arrangement for the smoothing of a solder strip and FIG. 9 a schematic diagram of a solar cell in plan view.

From the figures, in which fundamentally equal elements are provided with the same reference symbols, purely basic arrangements and measures for the application of solder onto a plane work piece and soldering-on of the solder onto the work piece can be gathered. In this context the teaching according to the invention is explained in what follows based on a solar cell as work piece without that thereby a limitation would ensue. Likewise the described transport installations are to be understood as examples and can be replaced by similarly acting elements that assure the explained effect so that the corresponding technical terms can be understood as synonyms.

From FIG. 1 a transport system 10 can be gathered by means of which the solar cells 12 are conveyed through the soldering station that basically can be gathered from FIG. 3 and features the reference symbol 14.

A transport installation 20 encompasses two drive belts 22, 24 that are spaced apart facing each other and that are driven via common drive belt discs 26, 28. The drive belts 22, 24 drive, via a shaft 27, drive belt discs 29, 30 that are connected with one another. From the shaft 27 originates a flat belt pulley 32 around which a highly elastic flat belt 34 is guided and driven. The flat belt 34 is furthermore guided around an additional flat belt pulley 36. In the graphical representation of the FIG. 1 runs, above the flat belt 34 and guided around guide rollers or -discs 38, 40, a flat belt 42, between which and the highly elastic flat belt 34 the solar cell 12 is conveyed through the soldering station 14. The transport of the flat belt 42 takes place according to this by means of frictional engagement with the flat belt 34 or the solar cell 12 to be processed, provided that said solar cell has been introduced via the drive belts 22, 24 into the area between the flat belt 34, 42. The alignment of the flat belts 34, 42 and therefore their support takes place thereby in such a manner that the required open space between the flat belt 34, 42 is available for the conveyance of the solar cell 12.

A comparison of FIGS. 1 and 2 clarifies that the solar cell 12 is engaged approximately in the middle by the flat belts 32, 42 and is transported by means of them.

Of course there is also the possibility that utilized for the transport of the solar cell 12 are two lower flat belts, which are spaced apart to one another, and two upper flat belts that associated with these, so that said solar cell makes contact with the flat belts in two spaced apart and strip-shaped areas.

The transport direction is indicated with T.

In order to apply solder onto the solar cell 12, the soldering station 14 is adjusted in the direction of the solar cell at that time when the solar cell 12 is located in the area of the soldering station 14—this can be determined by means of a sensor that is not represented. Control signals required therefore can be generated by the at least one sensor. The adjustment of the soldering station 14 in the direction of the solar cell 12 takes place in the manner described in what follows in order that a contact is established between the sonotrode head 44 of an ultrasound oscillator 58 and the solder that is discharged from the soldering station 14 and applied onto the solar cell 12. The driven highly-elastic flat belt 34 delivers thereby the required counter force for the non-destructive contacting of the sonotrode head 44 and the solar cell 12 and—to the extent they exist—the runners 46, 48 of a heating device 50 that are placed on the solar cell 12. The heating device 50 is supplied via a feed device 52 with solder that melts in the heating device 50 and is applied via the discharge opening 54 onto the solar cell 12 directly in front of the sonotrode head 44. The feed device 52 is thereby isolated against the heating device 50 by means of the delivery feed isolation 56.

The elastic modulus E in $kN/mm^2$ of the flat belt 34 should be in the range between $0.01\ kN/mm^2$ and $0.1\ kN/mm^2$ in order to support the solar cell 12 sufficiently elastically so that during the application of the solder and the interaction with the sonotrode 44 or the ultrasound oscillations created by it a destruction of the solar cell 12 is ruled out.

If for example the transport element is a drive belt, then this belt presses the work piece with a force K, which according to Hooke's law is proportional to the excursion $\Delta x$, against the sonotrode: $K=k^*\Delta x$.

The constant of proportionality is between 1 n/mm and 100 N/mm, whereby it is preferably $5N/mm \leq k \leq 50\ N/mm$. This value is valid when the work piece is a solar cell that is sensitivity to breakage with a thickness of 160-200 μm. In the case of an excursion of 0.2 mm the force amounts to 2 N.

In this case the elastic modulus of the belt was 0.01 to 0.1 $kN/mm^2$. This is just one example. One can also alternatively test by means of an experiment whether the solar cell or an arbitrary work piece develops cracks under the pressure of the sonotrode or whether it breaks.

The sonotrode head 44 is the tip of the ultrasound oscillator 58 which is a device such as is known from metal ultrasound welding. If applicable the oscillator 58 can encompass a booster. The ultrasound oscillator generates ultrasound oscillations in the desired frequency range, preferably in the range between 20 kHz and 80 kHz. In this case this concerns longitudinal waves, wherein the oscillator 58 is tuned to the wavelength of the ultrasound oscillations in such a manner that an antinode is located in the range of the sonotrode head 44, and namely in the area in which the sonotrode head 44 contacts the solder that is applied to the solar cell 12.

The sonotrode head 44 touches the solder that is applied to the surface of the solar cell with its tip. This can be in principle also gleaned from the FIGS. 5-7. Since the solder does not have to be heated via the sonotrode head 44 or its tip, the diameter of the sonotrode head or the tip can be reduced. The contact surface between the sonotrode head 44 and the solder can be thereby minimized in comparison with known arrangements in order to manufacture narrower as well as also broader—as desired—conduction paths. As a result the extent of the tip of the sonotrode head 44 can be positioned at right angles to the application direction of the solder, meaning perpendicularly to the transport direction T readily in the range between 0.5 mm and 5 mm.

It is furthermore implied in principle by the figure that inert gas can be supplied via a valve 60 via channels 62 to the solder location, meaning the area where the solder exits the nozzle 54 and makes contact with the sonotrode head 44. The nozzle channel 62 is thereby correspondingly isolated against the heating device 50 (reference symbol 64).

In order to be able to align the heating device 50—oscillator 58 toward the surface of the solar cell 12, the soldering station 14 originates from a mounting plate 66 that is connected with a stationary retaining means, such as a frame.

In order for the heating 50 and consequently the runners 46, 48 and the oscillator 58 and thereby the sonotrode head 44 to be able to be adjusted in the x-direction, an angle plate 68, which consists of two plate elements 70, 72 that can be adjusted against one another, is connected with the mounting plate 66. In reference to the connection point of the plate elements 70, 72 an angle of ±5° to the vertical (Z-direction) can be adjusted.

The angle plate 68 is connected, by means of an adapter plate 74, with a lifting unit 76, by means of which the unit of oscillator 58—heater 50 is adjustable in the z-direction. The lifting unit 76 makes as a result the lowering or lifting of the solar cell 12 to be processed possible A precision adjustment unit 78 is connected with the lifting unit 76 via the adapter plate 80. The precision adjustment unit 78 permits an additional adjustment in the z-direction in order to thereby make the exact adjustment of the sonotrode head 44 relative to the solar cell 12 possible; also relative to its surface, whereby the thickness or height of the solder to be soldered-on is prescribed.

The precision adjustment unit 78 is connected via an additional adapter plate 82 with an adjustment apparatus 84 that is connected with an angle element 86 from which the heater 50 and the oscillator 58 originate.

The adjustment apparatus 84 makes possible the adjustment of the angle element 86 in the y-direction.

The heating device 50 is rigidly connected, utilizing the angle element 86, with the soldering supply device 52 and the gas connection 60 as well as the gas channels 62. Relative to these the oscillator 58 is adjustable in the z-direction via an adjustment unit 85. For this purpose an attachment element 88 such as a clamp originates from the adjustment apparatus 85, such that said clamp encompasses the oscillator 58. The attachment element 88 runs thereby in the node of the oscillator 58.

By means of a construction of the soldering station 14 in this regard the possibility exists to align the oscillator 58 and thereby the sonotrode head 44 toward the surface of the solar cell 12 to the desired extent in order to however simultaneously offer the possibility that the runners 46, 48 of the heating device 50 are braced on the solar cell surface. This however does not concern a stringent characteristic. Rather the runners 46, 48 that form part of the heating device 50 can also extend spaced apart from the solar cell 12.

If in the embodiment example the soldering station 14 is laid out in such a manner that the oscillator 58 is adjustable in reference to the angle element 86 exclusively in the z-direction, the possibility can at the same time be constructively provided that also an alignment of the longitudinal axis of the oscillator 58 takes place at a desired angle to the z-axis that extends along the normal to the surface of the solar cell 12. The possibility therefore exists to adjust desired angles of the sonotrode head 44 to the surface in order to be able to break up for example oxide layers to the required extent, provided that this is not possible to the required extend in the case of an alignment of the oscillator 58 along the normal.

In order to clarify this, schematic diagrams of alignments of the sonotrode head 44 toward the surface of the solar cell 12 are represented in the FIGS. 5 and 6.

As was explained previously, the influence of ultrasound of the ultrasound waves transmitted by the sonotrode 42 into the solar cell 12 can be affected by the deployed sonotrode shape and alignment relative to the solar cell 12. In FIG. 5 the sonotrode is thereby aligned with its longitudinal direction 43 in parallel to the normal to the surface of the solar cell 12. Consequently the ultrasound oscillations generated by the sonotrode 44 feature primarily longitudinal oscillation components that act on the solar cell 12 or the solder. The longitudinal axis of the sonotrode 43 extends at right angle to the surface of the solar cell 12. If the contact surface 45 of the sonotrode 44 that is to come into contact with the solder is aligned to the longitudinal axis 43 at an angle α with α≠90°, then the generated ultrasound oscillations are divided into a longitudinal and a transverse oscillation component (see FIG. 6). With this variation it is prevented that for example an indestructible surface layer such as a $SiN_x$-layer of the solar cell 12 during the soldering of the solder is not mechanically stressed in such a manner that the solder comes in contact directly with the semiconductor layer, with the consequence that short circuits are prevented. In other words, it is assured that the surface layer remains sealed.

Measures in this regard are particularly then advantageous when for example the current collectors 112, 114, 116 that form fingers that are present on the front side of the solar cell 12 are connected in an electrically conducting manner by means of bars or strips 118, 120 that consist of solder and that therefore replace the current conductors or busbars that according to prior art consist in particular of silver. A cost-effect electrically conducting connection of the fingers 112, 114, 116 takes place hereby. From the soldering lanes 118, 120 that form the busbars the connectors, such as tinned copper connectors, can then originate that are required for the interconnecting of solar cells 12 and which are soldered together with the solder lanes 118, 120. The corresponding connectors are identified in FIG. 9 with the reference symbols 122, 124.

The heat of the solar cell 12 required in order to be able to solder the solder is preferably transferred according to the invention by the solder itself, wherein, if applicable, a pre-heating of the solar cell 12 can take place via the heating device 50 or the runners 46, 48.

The possibility also exists that the sonotrode head 44 is heated to the temperature of the heating device 50. This is however not a stringent characteristic.

Due to the fact that the heat required for the melting of the solder, in a deviation from previously known techniques, is not transferred via the sonotrode head 44, said sonotrode head can be implemented in the area of the contact with the solder relatively narrowly or with a minor cross section or diameter. In particular it is provided that the extent of the sonotrode head is between 0.5 mm and 5 mm and placed perpendicularly to the direction of application, which corresponds to the transport direction T, wherein the cross section can be a circle, an ellipse or a rectangle or square. In the case of a rectangle the side length can consequently be 0.5 mm-5 mm perpendicularly to the application direction and in the case of a circle or an ellipse the diameter or extent of the ellipse can be 0.5 mm-5 mm perpendicularly to the transport direction, wherein also deviating sizes, in particular extensions into the cm-range, can be selected provided this is necessary.

An additional variation that is encompassed by the teaching according to the invention can be gathered from FIG. 7 in order to heat the solar cell 12 to the desired extent. Consequently instead of a heating device 50 that serves the purpose of pre-heating the solar cell 12 and melting or heating the solder material, a heating device 51 can be utilized that encompasses a hot-air nozzle. The warm air released by the hot-air nozzle 51 serves thereby the purpose of pre-heating the solar cell 12 or melting or further heating the solder material. The heated air impinges at a desired angle on the contact area between solar cell 12 and the soldering material and is preferably aligned toward the contact area between the sonotrode 44 and the solar cell 12, as can be gathered in principle from the FIG. 7. The soldering material can therefore be melted directly at the, if applicable, likewise heated sonotrode 44 in order to then solder-on the soldering material by means of ultrasound.

For the further processing it can be desirable that the applied soldering material is smoothed or present oxidation is diminished and/or possible contaminations are removed from the surface since due to the influence of ultrasound the electrically conducting contact surface on the solar cell tends toward increased oxidation because of unevenness or contaminations. In order to lower the oxidation and to remove possible contaminations on the surface, it is provided according to the invention that a renewed melting and smoothing of the contact surface takes place. To that effect it is according to FIG. 8 in principle provided that the solder contact surface is melted after the seizing with the aid of a heating element such as heat rail 126 and is melted and smoothed by means of relative movement between the solar cell 12 and the heating rail 126. The corresponding soldering lane or soldering strip is labeled in FIG. 8 with the reference symbol 128.

These measures can be performed in the soldering station 14 itself, however only in the case where an electrical conductor is not soldered-on immediately after the application of the solder onto the soldering strip.

The method according to the invention is in particular suited for continuous flow processes. Thereby semiconductor components such as solar cells can be provided with soldering lanes in several lanes in parallel and simultaneously. In order to solder onto the backside as well as also on the front side corresponding soldering lanes by means of ultrasound, the solar cells can be delivered from a first soldering station to a second soldering station. This can take place for example with the aid of a turning wheel or another suitable installation.

What is claimed is:

1. A method for the application of solder onto a work piece that is transported using a transport device, wherein solder is soldered on at a soldering temperature $T_L$ and by means of a sonotrode subject to the influence of ultrasound, wherein:
   the solder is first supplied by a feed device to a heating device, wherein the feed device is coupled to the heating device by an angle plate,
   the solder is heated by the heating device to form melted solder,
   the melted solder is then applied to the work piece via a discharge opening of the heating device directly in front of the sonotrode, and
   the solder is soldered onto the work piece by means of the ultrasound applied via the sonotrode;

wherein the solder is soldered onto the work piece in strips; and wherein the work piece is supported in a spring-mounted manner during the soldering, so that the work piece is pressed towards the sonotrode.

2. A method according to claim 1, wherein the solder is heated by means of a heating device to a temperature $T_L$ with $T_L \geq T_M$, wherein $T_M$=melting temperature of the solder.

3. A method according to claim 1, wherein the heat required for the soldering-on is transferred via the solder onto the work piece.

4. A method according to claim 1, wherein the solder is heated via the heating device that is brought into contact with the work piece at least temporarily during a relative movement between the work piece and the heating device.

5. A method according to claim 4, wherein the heating device is guided along the work piece in a sliding manner.

6. A method according to claim 1, wherein the height of the solder deposited by the sonotrode head onto the work piece is dependent on a distance between the sonotrode head and the work piece surface.

7. A method according to claim 1, wherein the longitudinal axis of a sonotrode that is applying the ultrasound is aligned at an angle $\alpha$ to the normal to the work piece, wherein $0° \leq \alpha \leq 90°$.

8. A method according to claim 1, wherein the tip of the sonotrode that comes in contact with the solder extends in the antinode of the sonotrode that is excited with ultrasound.

9. A method according to claim 1, wherein for the purpose of the application of the ultrasound oscillations, a sonotrode with a sonotrode head is used whose tip that contacts the solder features a width that is equal to or wider than the width of a soldering strip that is applied onto the work piece.

10. A method according to claim 1, wherein for the application of the ultrasound oscillations, a sonotrode is used with a sonotrode head with an area that comes in contact with the solder and that consists of a hard material relative to the solder.

11. A method according to claim 1, wherein a solder is used that contains an abrasive, or that a solder is utilized that contains a component that acts as an abrasive and that precipitates during a lowering of the temperature.

12. A method according to claim 1, wherein, after the seizing of the solder, the solder is re-heated and smoothed by means of pressurization.

13. A method according to claim 1, wherein the soldering zone between solder and work piece is surrounded by an inert gas such as $N_2$, argon, or a forming gas.

14. A method according to claim 1, wherein, during the soldering-on of the solder onto the work piece an electrical conductor is soldered onto the solder, or that after the soldering-on of the solder, in a separate process step subject to the supply of thermal energy, an electrical conductor is soldered onto the solder that was soldered onto the work piece.

15. A method according to claim 1, wherein on a solar cell as the work piece the solder is soldered on in lanes or strips for the formation of busbars for the electrically conducting connection with current collectors that are present on the solar cell.

16. A method according to claim 1, wherein the height of the solder above the work piece is adjusted by means of an application amount of the solder.

17. A method according to claim 1, wherein the sonotrode comprises a sonotrode head, and wherein the sonotrode head comprises a hard material layer, relative to the solder, selected from the group consisting of tungsten carbide, SiC, and diamond.

18. A method according to claim 11, wherein the abrasive is a material selected from the group consisting of $Al_2O_3$, SiC, $Si_3N_4$, and $SiO_2$.

* * * * *